United States Patent
Koh (10) Patent No.: US 7,189,629 B2
(45) Date of Patent: Mar. 13, 2007

(54) METHOD FOR ISOLATING SEMICONDUCTOR DEVICES

(75) Inventor: Kwan Joo Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 13 days.

(21) Appl. No.: 11/024,632

(22) Filed: Dec. 30, 2004

(65) Prior Publication Data

US 2005/0142775 A1    Jun. 30, 2005

(30) Foreign Application Priority Data

Dec. 31, 2003    (KR)    ............ 10-2003-0101154

(51) Int. Cl.
*H01L 21/76*    (2006.01)
(52) U.S. Cl. ............ 438/433; 438/434; 438/440
(58) Field of Classification Search ........ 438/424, 438/433, 434, 435, 440, 443
See application file for complete search history.

(56) References Cited

U.S. PATENT DOCUMENTS

| 5,498,566 | A | * | 3/1996 | Lee ........................... 438/425 |
| 5,885,883 | A | * | 3/1999 | Park et al. .................. 438/435 |
| 6,133,117 | A | * | 10/2000 | Tung ......................... 438/433 |
| 6,248,645 | B1 | * | 6/2001 | Matsuoka et al. .......... 438/424 |
| 6,355,540 | B2 | * | 3/2002 | Wu ............................ 438/433 |
| 2004/0152324 | A1 | * | 8/2004 | Bentum et al. ............. 438/690 |
| 2005/0118784 | A1 | * | 6/2005 | Kim .......................... 438/424 |

* cited by examiner

*Primary Examiner*—Walter L. Lindsay, Jr.
(74) *Attorney, Agent, or Firm*—Mayer, Brown, Rowe & Maw LLP

(57) ABSTRACT

A method of isolating semiconductor devices including forming a pad layer on a semiconductor substrate, forming a trench by etching the semiconductor substrate to a predetermined depth using the pad layer as an etch barrier, implanting ion impurities into a bottom of the trench so as to increase an oxidation rate thereat, performing heat treatment for activating ion implanted impurities, growing a liner oxide film on a bottom and a sidewall of the trench, forming an isolation film on the liner oxide film so as to fill the trench, and smoothing the isolation film.

6 Claims, 9 Drawing Sheets

METHOD FOR ISOLATING SEMICONDUCTOR DEVICES

BACKGROUND OF THE INVENTION

1. Field of the Invention

The present invention relates to a method for manufacturing a semiconductor device, and more particularly, to a method for isolating semiconductor devices.

2. Discussion of the Related Art

A shallow trench isolation process has been applied to a device isolating process enabling the removal factors of instability of a process. These factors of instability include heat treatment of a field oxide film according to reduction of a design rule of a semiconductor device. Application of a shallow trench isolation process also fundamentally solves a problem such as reduction of an active region according to a bird's beak. Shallow trench isolation is also predicted to be applied to a process of manufacturing a highly integrated semiconductor device of more than 1G DRAM or 4G DRAM.

In the STI process, a pad oxide film and a nitride film are formed on a silicon substrate. After a trench mask is formed by selectively etching the pad oxide film and the nitride film, a trench is formed by carrying out dry etching on the silicon substrate using the patterned nitride film as an etch mask. Subsequently, an oxide film for filing up the trench is deposited to fill the trench, and chemical mechanical polishing (CMP) is performed. Then, the pad oxide film and the pad nitride film are removed to form a device isolating film.

Figure 1:
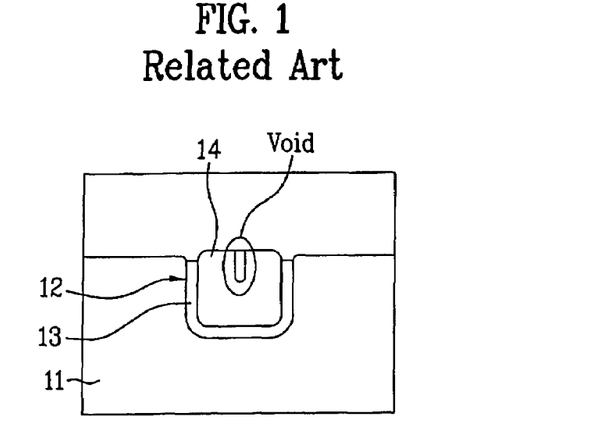
FIG. 1 illustrates a diagram showing a void in a trench in accordance with a related art.
Figure 2:
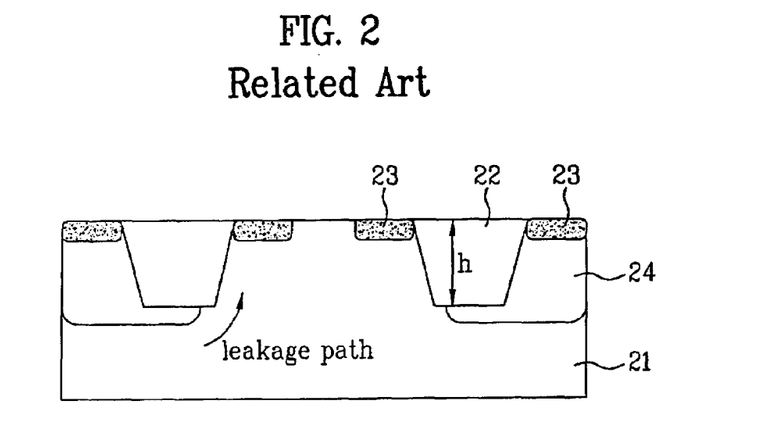
FIG. 2 illustrates a diagram showing a conventional device isolating structure with a reduced depth of the trench.

FIG. 1 and FIG. 2 illustrate cross sectional views showing a method for isolating semiconductor devices in accordance with a related art. As a semiconductor has been highly integrated, a width of a trench, that is, a device isolating region, has been reduced.

Accordingly, an aspect ratio has been relatively increased, thereby resulting in a difficulty in adequately filing in the trench.

FIG. 1 illustrates a diagram showing a void in a trench in accordance with a related art. As illustrated in FIG. 1, a liner oxide film 13 is formed on a surface of a trench 12 formed on a semiconductor substrate 11, and an isolation film 14 is vapor deposited on the liner oxide film 13 so as to fill the trench 12.

However, when a width of the trench 12 is reduced, the trench 12 may not be filled completely, forming the void in the isolation film 14. Accordingly, in a next process, the void becomes a source of leakage when a polysilicon film used as a gate material is filled in the void. In addition, when the void is large, it is difficult to isolate the devices. Therefore, a technology of reducing a depth of the trench more and more is demanded so as to reduce the aspect ratio.

FIG. 2 illustrates a diagram showing a related art device isolation structure having a trench with a reduced depth. As illustrated in FIG. 2, a device isolating film 22 with a trench structure for isolating between NMOSFETs on a P type substrate 21 isolates regions between a plurality of N type interfaces 23 of the NMOSFET, and the NMOSFET includes a P well 24.

As illustrated in FIG. 2, when a depth h of the trench is reduced, a leakage path is formed between adjacent NMOSFETs, thereby severely affecting reliability of the device.

SUMMARY OF THE INVENTION

Accordingly, the present invention is directed to a method for isolating semiconductor devices that substantially obviates one or more problems due to limitations and disadvantages of the related art.

The present invention advantageously provides a method for isolating semiconductor devices, enabling to reduce an aspect ratio and prevent a leakage path from being formed.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for isolating semiconductor devices includes forming a pad layer on a semiconductor substrate, forming a trench by etching the semiconductor substrate to a predetermined depth using the pad layer as an etch barrier, implanting ion impurities into a bottom of the trench so as to increase an oxidation rate thereat, performing heat treatment for activating implanted ion impurities, growing a liner oxide film on a bottom and a sidewall of the trench, forming an isolation film on the liner oxide film so as to fill the trench, and smoothing the isolation film.

In another aspect of the present invention, a method for isolating semiconductor devices includes forming a pad layer including at least one pad nitride film on a semiconductor substrate, forming a trench by etching the semiconductor substrate to a predetermined depth using the pad layer as an etch barrier, forming a sacrificing oxide film on a front surface including the trench, forming a nitride sidewall on the sacrificing oxide film at the sidewall of the trench, performing impurity ion implantation on a bottom of the trench exposed to an outside of the sidewall of the nitride film so as to increase an oxidation rate thereat, performing heat treatment for activating implanted ion impurities, removing the nitride sidewall and the sacrificing oxide film, growing a liner oxide film on both a bottom and a sidewall of the trench, forming a nitride film on the liner oxide film so as to fill the trench, and smoothing the isolation film.

In an exemplary embodiment, in the step of performing the impurity ion implantation, the impurity is selected from n type impurity, p type impurity, and a nitride ion.

In an exemplary embodiment, in the step of impurity ion implantation, energy is in a range of about 25 to about 100 keV and a dose of impurity is about $1 \times 10^{12}$ cm$^{-3}$ to about $1 \times 10^{18}$ cm$^{-3}$.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4A through FIG. 4I illustrate cross sectional views showing a method for isolating semiconductor devices in accordance with a first embodiment of the present invention; and FIG. 5A through FIG. 5F illustrate cross sectional views showing a method for isolating semiconductor devices in accordance with a second embodiment of the present invention.

DETAILED DESCRIPTION OF THE INVENTION

Reference will now be made in detail to exemplary embodiments of the present invention which are illustrated in the accompanying drawings. Wherever possible, the same reference numbers will be used throughout the drawings to refer to the same or like parts.

In the following embodiments of the present invention, three exemplary methods are applied for reducing an aspect ratio. A first method is for reducing the aspect ratio of a trench through an oxidation process according to impurity implantation. The first method uses a difference between a first oxidation rate of pure silicon when an impurity diffusion area formed at a bottom of the trench forms a liner oxide film of a trench, and a second oxidation rate of silicon to which impurities are implanted. The oxidation rate of the silicon to which the impurities are implanted is several times to dozens of times higher depending on a dose amount. Accordingly, the oxidation rate at the bottom of the trench is higher than that on a sidewall thereof. Therefore, according to a feature that oxidation rates at top and bottom of silicon surfaces are a ratio of 0.46:0.54 when a trench with a same depth is formed, there is an advantage that the aspect ratio of the trench at the top of the trench is reduced and thus the trench with a deeper depth is formed at the bottom thereof.

Figure 3:
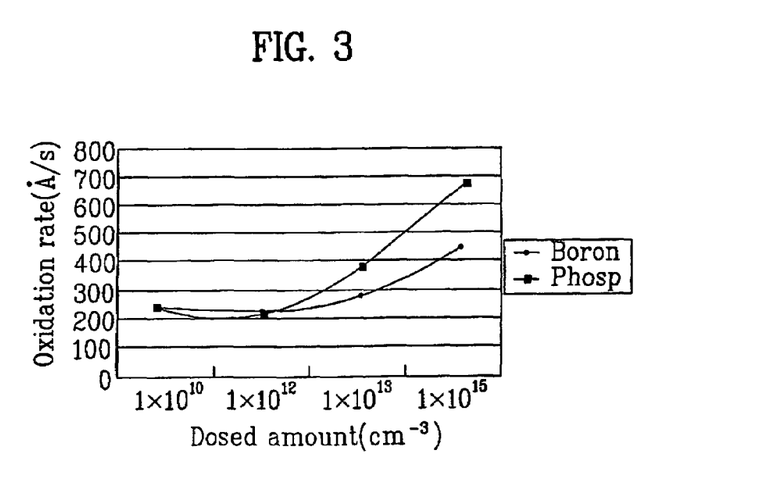
FIG. 3 illustrates a diagram comparing a normal oxidation ratio and an oxidation ratio according to injected impurities.

FIG. 3 is a diagram for comparing a normal oxidation rate and an oxidation rate according to impurity implantation. FIG. 3 also shows an oxidation rate according to doses of phosphorus (P) and boron (B). As illustrated in FIG. 3, at a low dose of less than $1 \times 10^{12}$ cm$^{-3}$, both of the oxidation rates of (P) and (B) are about 200 Å/s and there are almost no changes in the oxidation rates. At a high dose of larger than $1 \times 10^{12}$ cm$^{-3}$, the oxidation rates however are changed according to an exponent and are increased to about 400 Å/s (B) or 700 Å/s (P).

A second exemplary method is for implanting impurities. Generally, when an impurity area is formed in silicon and then an oxidation process is performed thereon, an impurity layer is moved to a lower part of an oxide film and thereby formed. In this case, if the trench is formed low, the second method is used to prevent a leakage path from being formed at a lower part of the trench. The second method includes the steps of, during the impurity implantation, implanting P type impurities in case of a NMOSFET or N type of impurities in case of a PMOSFET, and forming a depletion region at the lower part of the trench, thereby removing the leakage path.

A third exemplary method is also used to implant impurities. Contrary to the second method, the third method uses nitride ions [N+]. The third method prevents the leakage path from being formed by implanting the chemically stable nitride ion [N+] into the lower part of the trench and thereby forming a stable nitride trap layer.

Figure 4A:
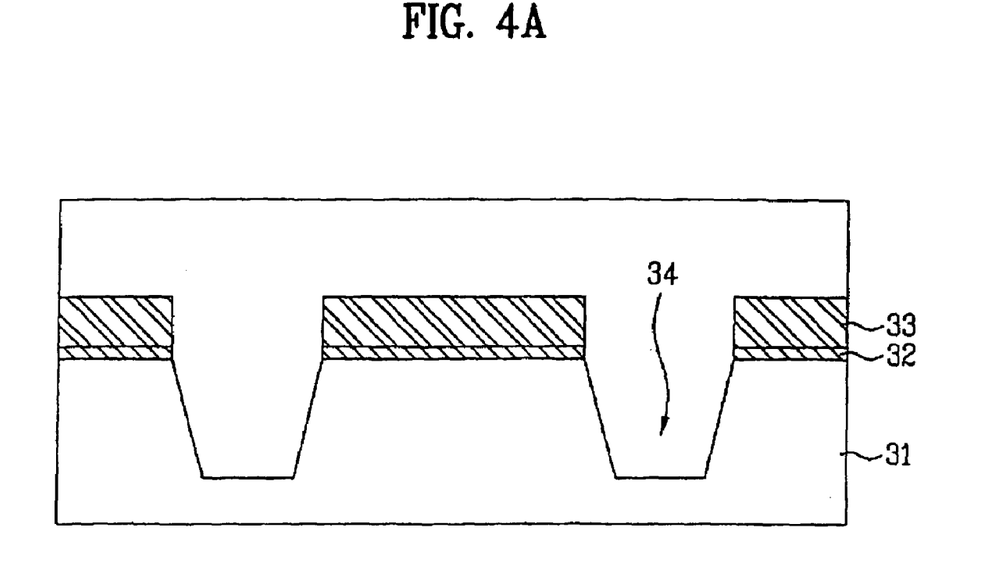

FIG. 4A to FIG. 4I are diagrams showing a method for isolating semiconductor devices in accordance with a first embodiment of the present invention. In the first embodiment, the trench for isolating the semiconductor devices narrows as it get deeper and has a reduced depth for reducing the aspect ratio. As illustrated in FIG. 4A, a pad oxide film 32 and a nitride film 33 are sequentially formed on a semiconductor substrate 31. In this case, the pad oxide film 32 is about 100 to about 200 Å thick and the pad nitride film 33 is about 300 to about 1000 Å thick.

A device isolating mask (not shown) is formed on the pad nitride film 33. After the pad nitride film 33 and the pad oxide film 32 are patterned with the device isolating mask, a device isolating region in the semiconductor substrate 31 is etched to a predetermined depth so as to form a trench 34. Thereafter, the device isolating mask is removed by a strip process.

Figure 4B:
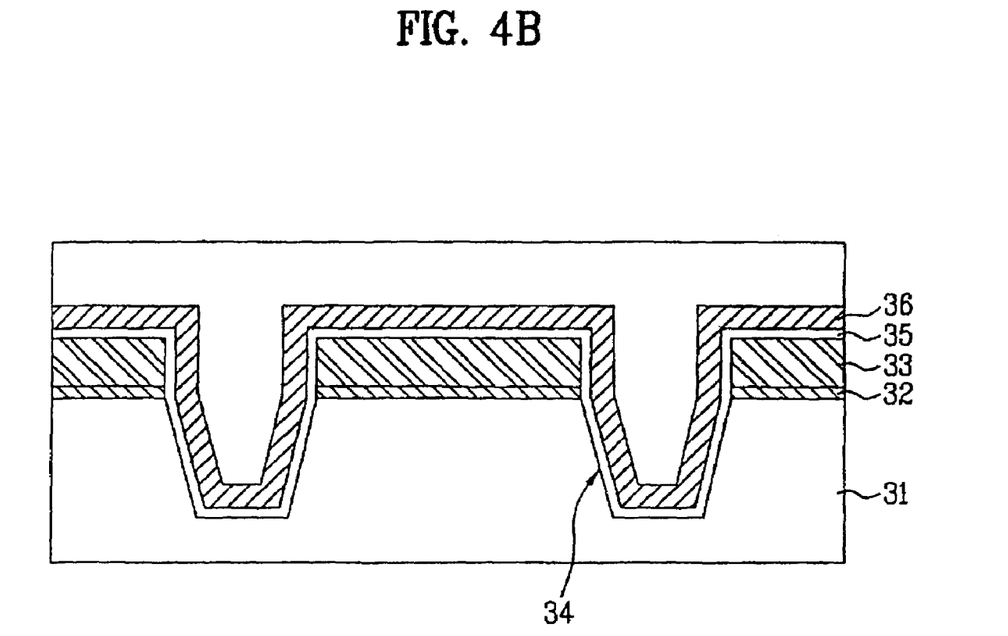
Figure 4C:
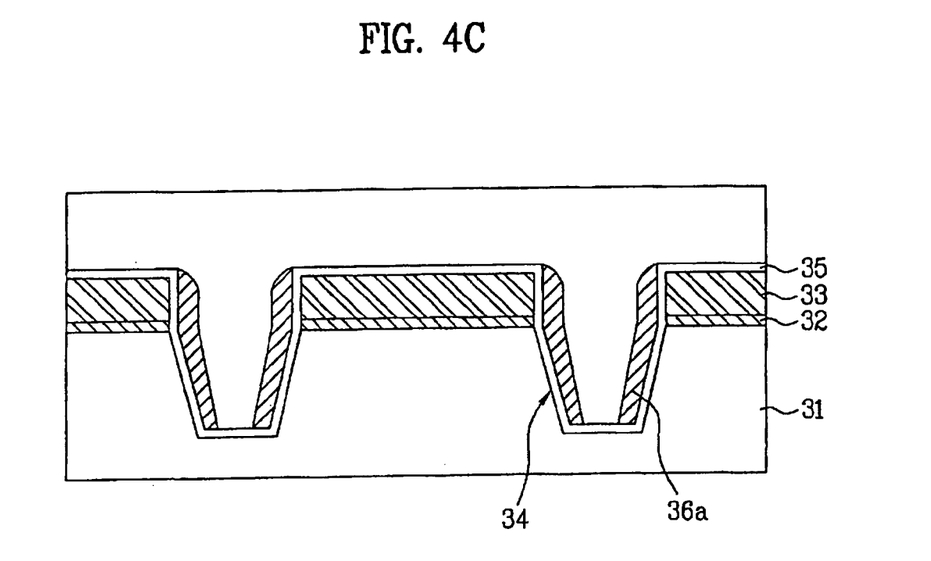

As illustrated in FIG. 4B, a sacrificing oxide film 35 and a sacrificing nitride film 36 are sequentially formed on the pad nitride film 33 including the trench 34. As illustrated in FIG. 4C, the sacrificing nitride film 36 is etched back using the sacrificing oxide film 35 as an etch barrier, so as to form a nitride sidewall 36a at a sidewall of the trench 34. In this case, the bottom of the trench is exposed because of formation of the nitride sidewall 36a.

Figure 4D:
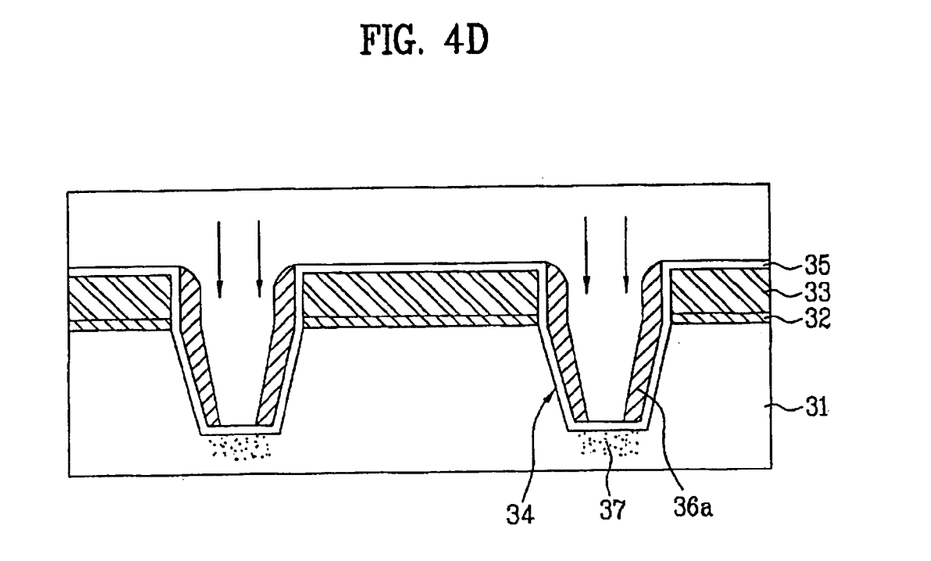

As illustrated in FIG. 4D, an impurity ion implantation is performed on the exposed bottom of the trench 34 using the nitride sidewall 36a as an ion mask.

In the impurity ion implantation, the second method (ion implantation of N type impurity or P type impurity) and the third method (ion implantation of nitride) are used, and the ion implantation is carried out in the condition of energy of about 25 to about 100 keV and dose of about $1 \times 10^{12}$ cm$^{-3}$ to about $1 \times 10^{18}$ cm$^{-3}$.

In this case, n type impurity or p type impurity is available. Phosphorus (P) or arsenic (As) may be used as the n type impurity, and boron (B), gallium (Ga), or indium (In) may be used as p type impurity. A nitride ion [N+] may be used as a trap and a stable ion.

An impurity-implanted layer 37 is formed at the bottom of the trench 34. In this case, the sidewall of the trench 34 is not affected by the impurity ion implantation because of the nitride sidewall 36a.

Figure 4E:
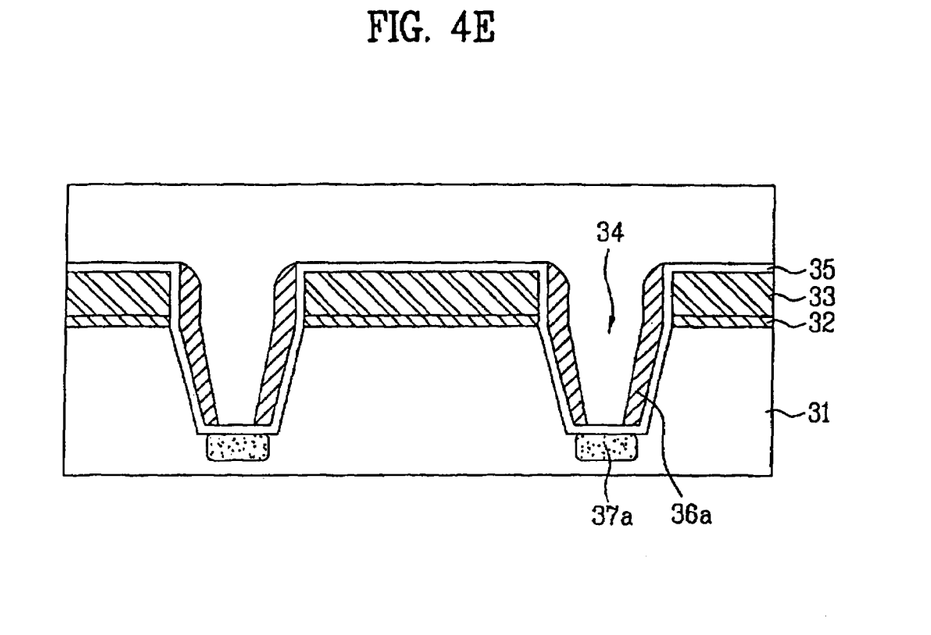

As illustrated in FIG. 4E, the impurity-implanted layer 37 is activated as an impurity diffusion area 37a by carrying out a heat treatment for activation of the impurity.

Figure 4F:
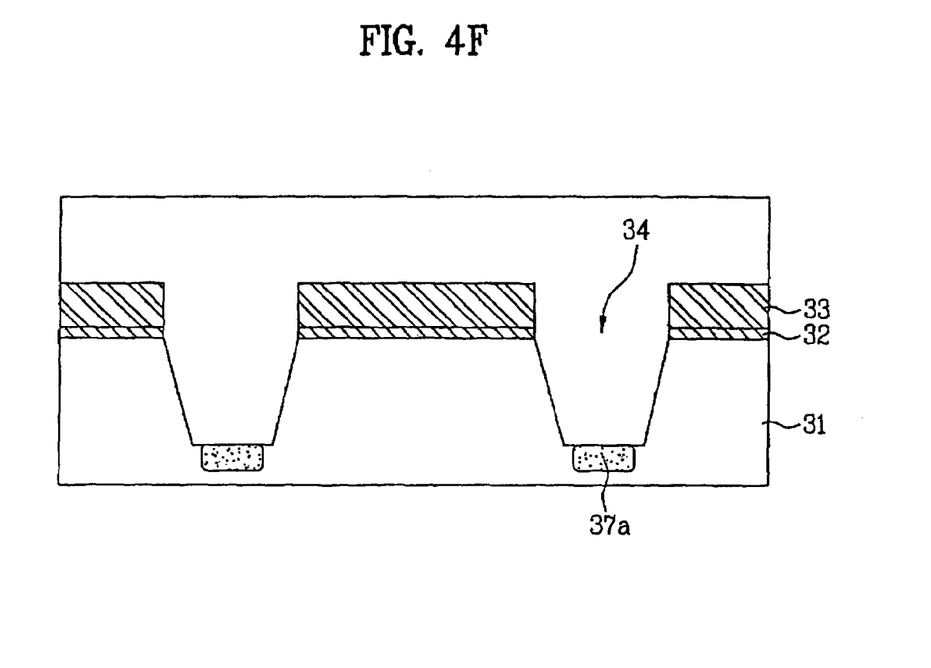

As illustrated in FIG. 4F, the nitride sidewall 36a and the sacrificing oxide film 35 are removed. In this instance, the nitride sidewall 36a is removed using a hot phosphoric acid ($H_3PO_4$) solution and the sacrificing oxide film 35 is removed using hydrofluoric acid (HF). In some embodiments, however, they may not be removed.

In the series of processes described above, when the nitride sidewall 36a is removed, the pad nitride film 33 is prevented from being exposed to the phosphoric acid solution because the sacrificing oxide film 35 plays the role of an etch barrier. When the sacrificing oxide film 35 is removed, the pad oxide film 32 is prevented from being exposed to hydrofluoric acid (HF) solution because the pad nitride film 33 plays the role of the etch barrier.

Figure 4G:
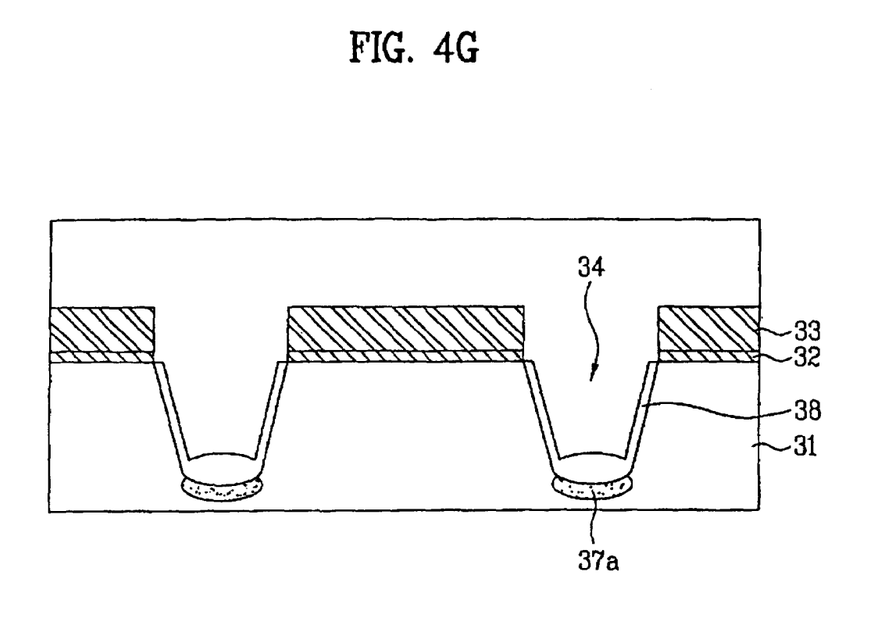

As illustrated in FIG. 4G, a liner oxide film 38 is formed through thermal growth on a surface of the trench 34. The trench 34 is re-exposed after the nitride sidewall 36a and the sacrificing oxide film 35 are removed. In this case, the liner oxide film 38 at a bottom of the trench 34 has a width different from that at a sidewall thereof. The liner oxide film formed at the bottom of the trench 34 is thicker than that on the sidewall thereof, the trench 34 having the impurity diffusion area 37a formed at the bottom thereof. The width is proportional to a thermal growth time of the liner oxide film 38.

Figure 4H:
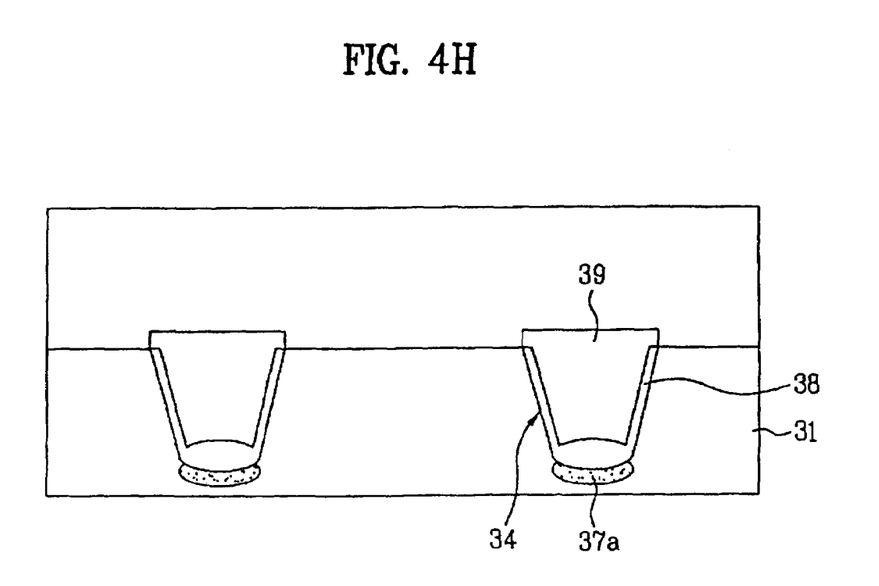

As illustrated in FIG. 4H, an isolation film 39 is formed on the liner oxide film 38 until the trench 34 is adequately filled, and then smoothed using CMP to remove remainder of the pad nitride film 33 and the pad oxide film 32.

In this case, the pad nitride film 33 is removed using a phosphoric solution, and the pad oxide film 32 is removed using hydrofluoric acid (HF).

Figure 4I:
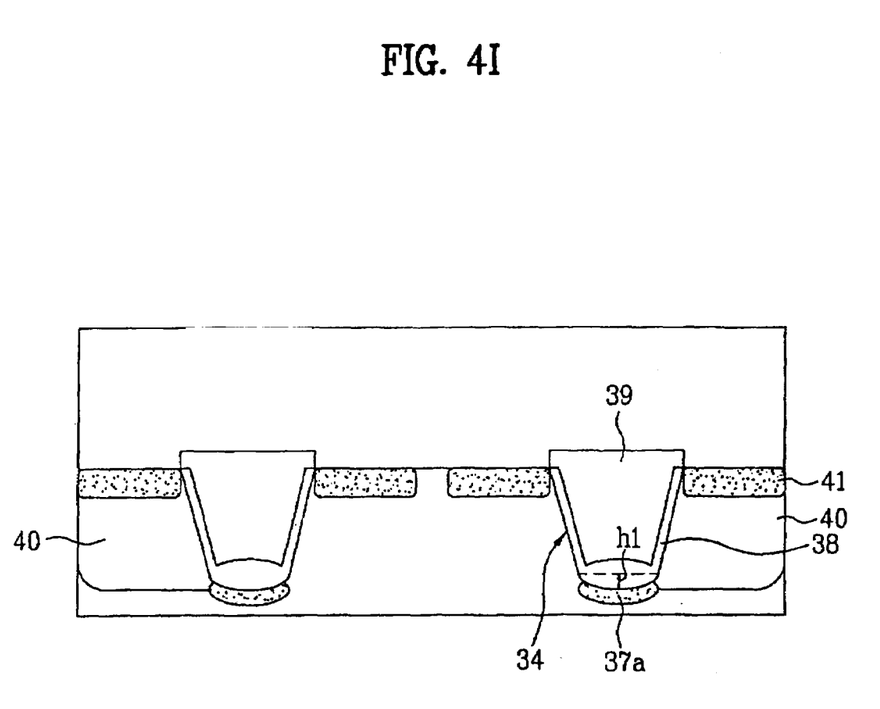

As illustrated in FIG. 4I, the impurity ion implantation is performed to form a well 40 on a semiconductor substrate 31 exposed after the removal of the pad oxide film 32. An ion implantation is performed to form a junction 41 such as a source/drain of the transistor.

In the first embodiment disclosed above, the trench 34 has not only a depth as deep as h1, but also the impurity diffusion area 37a formed at the bottom thereof so as to prevent a leakage path. In this case, the impurity diffusion area 37a is a depletion layer formed by implanting n type impurity or p type impurity, or a stable layer formed by the ion implantation of nitride.

FIG. 5A to 5F are diagrams showing a method for isolating semiconductor devices in accordance with a second embodiment of the present invention.

Figure 5A:
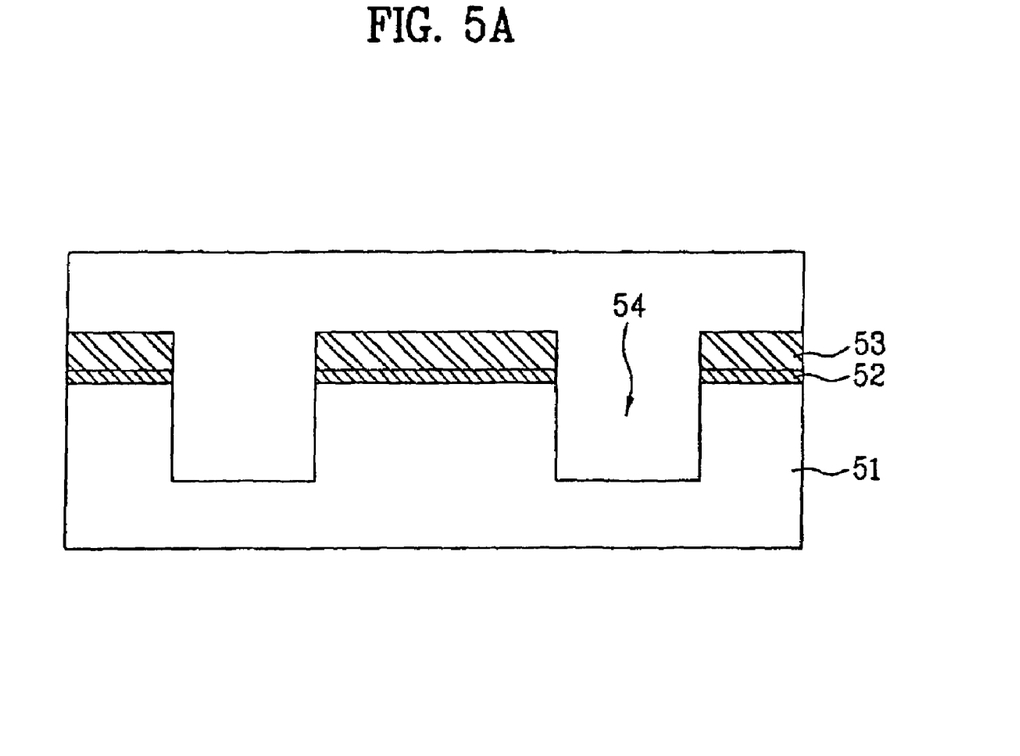

As illustrated in FIG. 5A, a pad oxide film 52 and a pad nitride film 53 are sequentially formed on a semiconductor substrate 51. In this case, the pad oxide film 52 is formed to be about 100 to about 200 Å thick and the pad nitride film to be about 300 to about 1000 Å thick.

A device isolating mask (not shown) is formed on the pad nitride film 53 using a sensitive film. The pad nitride film 53 and the oxide film 52 are patterned with the device isolating mask and a device isolating area of the semiconductor substrate 51 exposed is etched to a predetermined depth, so as to form a trench 54 having a vertical profile. The device isolating mask is removed by a strip process.

Figure 5B:
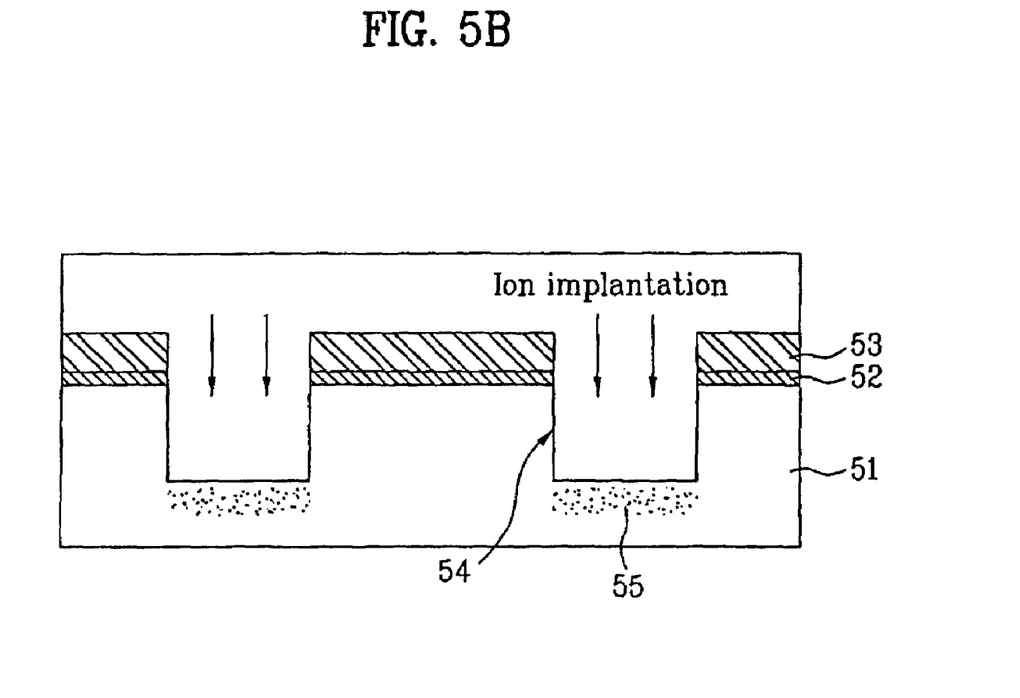

As illustrated in FIG. 5B, the impurity ion implantation is performed on the bottom of the trench 54 using the pad nitride film 53 as an ion implantation mask.

The impurity ion implantation uses the second and third methods, with an energy of about 25 to about 100 keV and a dose of about $1\times10^{12}$ $cm^{-3}$ to about $1\times10^{18}$ $cm^{-3}$. In this case, n type impurity or p type impurity may be used. Phosphorus (P) or arsenic (As) may be used as the n type impurity, and boron (B), gallium (Ga), or indium (In) may be used as the p type impurity. A nitride ion [N+] may be used as a trap and a stable ion.

An impurity implanted layer 55 is formed at the bottom of the trench 54 by the impurity ion implantation. Since a sidewall of the trench 54 is vertical, the ion implantation is not performed thereon.

Figure 5C:
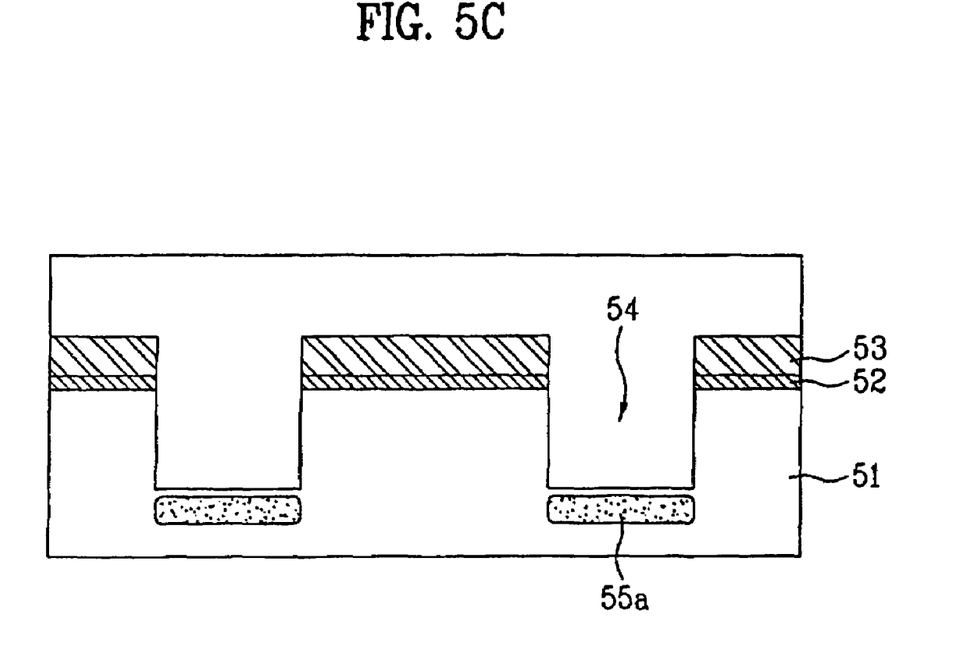

As illustrated in FIG. 5C, the impurity implanted layer 55 is activated as an impurity diffusion area 55a by carrying out heat treatment for activation of the impurity.

Figure 5D:
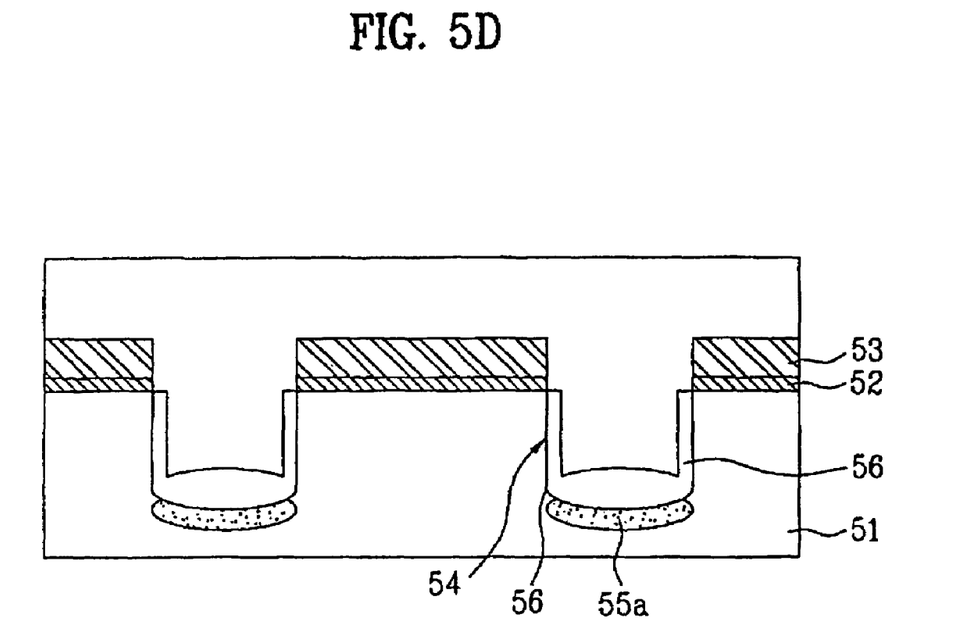

As illustrated in FIG. 5D, a liner oxide film 56 is formed on a surface of the trench 54 through thermal growth. In this case, the liner oxide film 56 formed at the bottom of the trench 54 is thicker than the liner oxide film formed at the sidewall thereof. The width is proportional to a thermal growth time of the liner oxide film 38.

Figure 5E:
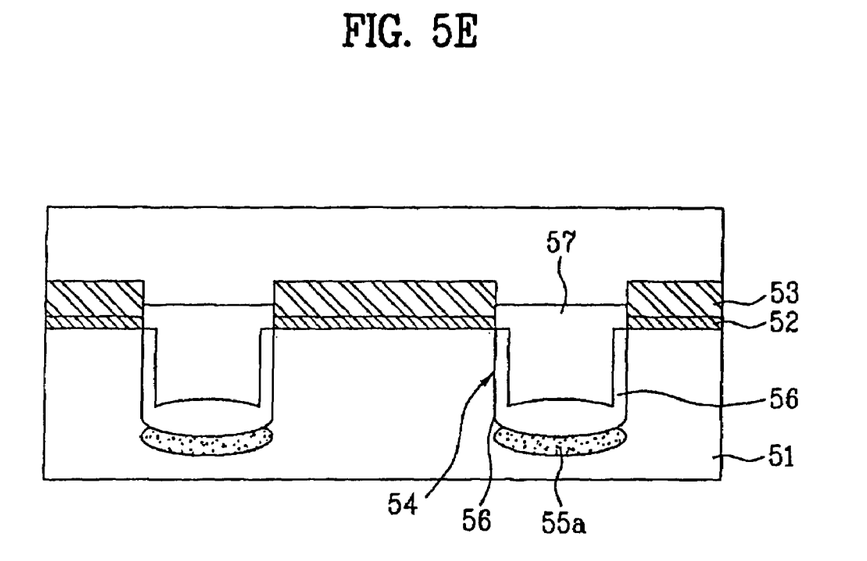

As illustrated in FIG. 5E, an isolation film 57 is formed on the liner oxide film 56 until the trench 54 is adequately filled, and then smoothed using CMP.

Figure 5F:
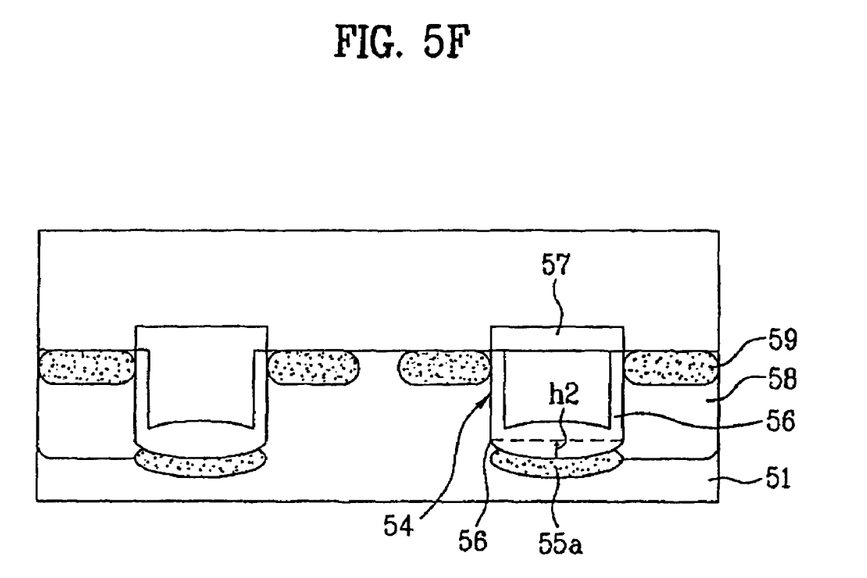

As illustrated in FIG. 5F, the remainder of the nitride film 53 and the pad oxide film 52 are removed. In this case, the pad nitride film 53 is removed using the phosphoric solution and the pad oxide film 52 is removed using hydrofluoric acid (HF) solution.

The impurity ion implantation is performed to form a well 58 on a semiconductor substrate 51 exposed after the removal of the pad oxide film 52. The ion implantation is performed to form a junction 59, such as a source/drain of the transistor.

In the first embodiment disclosed above, the trench 54 has not only a depth as deep as h1, but also the impurity diffusion area 55a formed at the bottom of thereof so as to prevent the leakage path. In this case, the impurity diffusion area 55a is a depletion layer formed by implanting n type impurity or p type impurity, or a stable layer formed by the ion implantation of nitride.

In forming microscopic circuits, the aforementioned present invention not only broadens a trench creation window, but also is applicable to a trench having various profiles.

Accordingly, the present invention has a higher oxidation rate at a bottom of a trench than at a sidewall thereof, thereby having effects of reducing an aspect ratio on a top of the trench and forming a deeper trench at the bottom of the trench.

Furthermore, the present invention has an effect of preventing a leakage path from being formed between neighboring transistors by forming a depleted layer or a stable layer, even though a depth of the trench is low.

Korean Patent Application No. P2003-01154, filed on Dec. 31, 2003, is hereby incorporated by reference in its entirety.

It will be apparent to those skilled in the art that various modifications and variations can be made in the present invention without departing from the spirit or scope of the inventions. Thus, it is intended that the present invention covers the modifications and variations of this invention within the scope of the appended claims and their equivalents.

What is claimed is:

1. A method for isolating semiconductor devices, comprising the steps of:
    forming a pad layer including at least one pad nitride film on a semiconductor substrate;
    forming a trench by etching the semiconductor substrate to a predetermined depth using the pad layer as an etch barrier;
    forming a sacrificing oxide film on a front surface including the trench;
    forming a nitride sidewall on the sacrificing oxide film at a sidewall of the trench;
    performing impurity ion implantation on a bottom of the trench exposed to an outside of the sidewall of the nitride film so as to increase an oxidation rate thereat;
    performing heat treatment for activating implanted ion impurities;
    removing the nitride sidewall and the sacrificing oxide film;
    growing a liner oxide film on both the bottom and the sidewall of the trench;
    forming a nitride film on the liner oxide film so as to fill the trench; and
    smoothing the isolation film.

2. The method of claim 1, wherein the step of forming a nitride sidewall comprises the steps of:
depositing the nitride film on the sacrificing oxide film; and
etching back the nitride film.

3. The method of claim 1, wherein the step of performing impurity ion implantation includes implanting an impurity selected from n type impurity, p type impurity, and a nitride ion.

4. The method of claim 1, wherein the step of performing impurity ion implantation includes implanting impurities with an energy in a range of about 25 to about 100 keV and a dose of impurity of about $1\times10^{12}$ $cm^{-3}$ to about $1\times10^{18}$ $cm^{-3}$.

5. The method of claim 1, wherein the trench has an inclined profile.

6. The method of claim 1, wherein the step of removing the nitride sidewall includes removing the nitride sidewall using a phosphoric acid solution and the step of removing the sacrificing oxide film includes removing the sacrificing oxide film using hydrofluoric acid.

* * * * *